United States Patent
Limb et al.

(10) Patent No.: US 10,947,150 B2
(45) Date of Patent: Mar. 16, 2021

(54) DECOY SECURITY BASED ON STRESS-ENGINEERED SUBSTRATES

(71) Applicant: Palo Alto Research Center Incorporated, Palo Alto, CA (US)

(72) Inventors: Scott J. Limb, Palo Alto, CA (US); Patrick Murphy, San Francisco, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 0 days.

(21) Appl. No.: 16/207,709

(22) Filed: Dec. 3, 2018

(65) Prior Publication Data

US 2020/0172430 A1    Jun. 4, 2020

(51) Int. Cl.
*C03C 4/00*    (2006.01)
*H01L 23/00*    (2006.01)
*H05K 1/02*    (2006.01)

(52) U.S. Cl.
CPC ............ *C03C 4/0064* (2013.01); *H01L 23/57* (2013.01); *H05K 1/0275* (2013.01)

(58) Field of Classification Search
CPC ..... H01L 23/57; H01L 23/573; H01L 23/576; H05K 1/0275; C03C 4/0064
See application file for complete search history.

(56) References Cited

U.S. PATENT DOCUMENTS

| | | |
|---|---|---|
| 2,529,210 A | 11/1950 | Butler |
| 3,397,278 A | 8/1968 | Pomerantz |
| 3,601,114 A | 8/1971 | Cook |
| 3,666,967 A | 5/1972 | Keister et al. |
| 3,673,667 A | 7/1972 | Lowenstein et al. |
| 3,882,323 A | 5/1975 | Smolker |
| 4,102,664 A | 7/1978 | Dunbaugh, Jr. |
| 4,139,359 A | 2/1979 | Johnson et al. |

(Continued)

FOREIGN PATENT DOCUMENTS

| DE | 102004015546 | 10/2005 |
|---|---|---|
| WO | 0143228 | 6/2001 |

OTHER PUBLICATIONS

File History for U.S. Appl. No. 15/229,385.

(Continued)

*Primary Examiner* — Jesse Y Miyoshi
(74) *Attorney, Agent, or Firm* — Mueting Raasch Group

(57) ABSTRACT

A system includes a stress-engineered substrate comprising at least one tensile stress layer having a residual tensile stress and at least one compressive stress layer having a residual compressive stress. The at least one tensile layer and the at least one compressive layer are coupled such that the at least one tensile stress layer and the at least one compressive stress layer are self-equilibrating. At least one functional device is disposed on the stress-engineered substrate. The stress-engineered substrate is configured to fracture in response to energy applied to the substrate. Fracturing the stress-engineered substrate also fractures the functional device. The system includes at least one decoy device. Fragments of the decoy device are configured to obscure one or more physical characteristics of the functional device and/or one or more functional characteristics of the functional device after the functional device is fractured.

23 Claims, 9 Drawing Sheets

(56) References Cited

U.S. PATENT DOCUMENTS

| | | |
|---|---|---|
| 4,471,895 A | 9/1984 | Lisec, Jr. |
| 4,558,622 A | 12/1985 | Tausheck |
| 4,598,274 A | 7/1986 | Holmes |
| 4,673,453 A | 6/1987 | Georgi |
| 4,739,555 A | 4/1988 | Jurgens |
| 5,374,564 A | 12/1994 | Bruel |
| 5,584,219 A | 12/1996 | Dunn et al. |
| 5,791,056 A | 8/1998 | Messina |
| 6,418,628 B1 | 7/2002 | Steingass |
| 7,002,517 B2 | 2/2006 | Noujeim |
| 7,068,254 B2 | 6/2006 | Yamazaki et al. |
| 7,153,758 B2 | 12/2006 | Hata et al. |
| 7,554,085 B2 | 6/2009 | Lee |
| 7,880,248 B1 | 2/2011 | Pham et al. |
| 8,130,072 B2 | 3/2012 | De Bruyker et al. |
| 8,740,030 B2 | 6/2014 | Purdy et al. |
| 9,154,138 B2 | 10/2015 | Limb et al. |
| 9,294,098 B2 | 3/2016 | Shah et al. |
| 9,356,603 B2 | 5/2016 | Limb et al. |
| 9,577,047 B2 | 2/2017 | Chua et al. |
| 9,630,870 B2 | 4/2017 | Zhao et al. |
| 9,780,044 B2 | 10/2017 | Limb et al. |
| 9,790,128 B2 | 10/2017 | Garner et al. |
| 10,012,250 B2 | 7/2018 | Limb et al. |
| 10,026,579 B2 | 7/2018 | Whiting et al. |
| 10,026,651 B1 | 7/2018 | Limb et al. |
| 10,308,543 B2 | 6/2019 | Lee |
| 10,717,669 B2 | 7/2020 | Murphy et al. |
| 2003/0089755 A1 | 5/2003 | Peers-Smith et al. |
| 2004/0031966 A1 | 2/2004 | Forrest |
| 2004/0222500 A1 | 11/2004 | Aspar et al. |
| 2005/0061032 A1 | 3/2005 | Yoshizawa |
| 2005/0082331 A1 | 4/2005 | Yang |
| 2005/0084679 A1 | 4/2005 | Sglavo et al. |
| 2005/0176573 A1 | 8/2005 | Thoma et al. |
| 2006/0138798 A1 | 6/2006 | Oehrlein |
| 2006/0270190 A1 | 11/2006 | Nastasi et al. |
| 2007/0113886 A1 | 5/2007 | Arao et al. |
| 2008/0029195 A1 | 2/2008 | Lu |
| 2008/0311686 A1 | 12/2008 | Morral et al. |
| 2009/0086170 A1 | 4/2009 | El-Ghoroury et al. |
| 2009/0224401 A1* | 9/2009 | Fujii ............... H01L 23/562 257/737 |
| 2010/0035038 A1 | 2/2010 | Barefoot et al. |
| 2010/0133641 A1 | 6/2010 | Kim |
| 2010/0225380 A1 | 9/2010 | Hsu et al. |
| 2011/0048756 A1 | 3/2011 | Shi et al. |
| 2011/0089506 A1 | 4/2011 | Hoofman et al. |
| 2011/0183116 A1 | 7/2011 | Hung et al. |
| 2012/0052252 A1 | 3/2012 | Kohli et al. |
| 2012/0135177 A1 | 5/2012 | Comejo et al. |
| 2012/0135195 A1 | 5/2012 | Glaesemann et al. |
| 2012/0196071 A1 | 8/2012 | Comejo et al. |
| 2012/0288676 A1 | 11/2012 | Sondergard et al. |
| 2013/0037308 A1 | 2/2013 | Wang et al. |
| 2013/0082383 A1 | 4/2013 | Aoya |
| 2013/0140649 A1 | 6/2013 | Rogers et al. |
| 2013/0192305 A1 | 8/2013 | Black et al. |
| 2013/0273717 A1 | 10/2013 | Hwang et al. |
| 2014/0091374 A1 | 4/2014 | Assefa et al. |
| 2014/0103957 A1 | 4/2014 | Fritz et al. |
| 2014/0266946 A1 | 9/2014 | Billy et al. |
| 2014/0300520 A1 | 10/2014 | Nguyen et al. |
| 2014/0323968 A1 | 10/2014 | Rogers et al. |
| 2015/0001733 A1 | 1/2015 | Karhade |
| 2015/0044445 A1 | 2/2015 | Garner et al. |
| 2015/0076677 A1 | 3/2015 | Ebefors |
| 2015/0089977 A1 | 4/2015 | Li |
| 2015/0102852 A1 | 4/2015 | Limb et al. |
| 2015/0121964 A1 | 5/2015 | Zhao et al. |
| 2015/0229028 A1 | 8/2015 | Billy et al. |
| 2015/0232369 A1 | 8/2015 | Majanovic et al. |
| 2015/0318618 A1 | 11/2015 | Chen et al. |
| 2015/0348940 A1 | 12/2015 | Woychik |
| 2015/0358021 A1* | 12/2015 | Limb .................. B32B 7/02 327/525 |
| 2015/0372389 A1 | 12/2015 | Chen et al. |
| 2016/0122225 A1 | 5/2016 | Wada et al. |
| 2016/0137548 A1 | 5/2016 | Cabral, Jr. et al. |
| 2017/0036942 A1 | 2/2017 | Abramov et al. |
| 2017/0217818 A1 | 8/2017 | Dumenil et al. |
| 2017/0292546 A1 | 10/2017 | Limb et al. |
| 2018/0005963 A1 | 1/2018 | Limb et al. |
| 2018/0033577 A1 | 2/2018 | Whiting et al. |
| 2018/0033742 A1 | 2/2018 | Chua et al. |
| 2018/0114761 A1 | 4/2018 | Chua et al. |
| 2018/0306218 A1 | 10/2018 | Limb et al. |
| 2018/0330907 A1 | 11/2018 | Whiting et al. |
| 2019/0106069 A1 | 4/2019 | Wheeler et al. |

OTHER PUBLICATIONS

File History for U.S. Appl. No. 16/433,603.
File History for U.S. Appl. No. 15/981,328.
File History for U.S. Appl. No. 16/273,397.
File History for U.S. Appl. No. 16/033,783.
File History for U.S. Appl. No. 15/299,385.
File History for U.S. Appl. No. 15/092,313.
File History for U.S. Appl. No. 15/220,221.
File History for U.S. Appl. No. 15/629,506.
File History for U.S. Appl. No. 15/726,944.
File History for U.S. Appl. No. 16/025,573.
Limb et al., U.S. Appl. No. 15/726,944, filed Oct. 6, 2017.
Murphy et al., U.S. Appl. No. 15/981,328, filed May 16, 2018.
File History for U.S. Appl. No. 14/796,440, 183 pages.
File History for U.S. Appl. No. 15/220,221, 198 pages.
File History for U.S. Appl. No. 15/220,164 192 pages.
File History for U.S. Appl. No. 15/629,506, 121 pages.
File History for U.S. Appl. No. 15/726,944, 145 pages.
File History for U.S. Appl. No. 15/689,566, 167 pages.
File History for U.S. Appl. No. 15/092,313, 195 pages.
Office Action from U.S. Appl. No. 16/204,996 dated Sep. 3, 2020, 18 pages.
File History for U.S. Appl. No. 16/257,304.

\* cited by examiner

DECOY SECURITY BASED ON STRESS-ENGINEERED SUBSTRATES

STATEMENT REGARDING FEDERALLY SPONSORED RESEARCH AND DEVELOPMENT

This invention is based upon work supported by DARPA under Contract No. HR0011-14-C-0013 DARPA-MTO-VAPR-DUST. The Government has certain rights to this invention.

TECHNICAL FIELD

This disclosure relates generally to devices comprising stress-engineered substrates configured to fracture in response to an applied energy and to related methods and systems.

BACKGROUND

Electronic systems capable of fracturing in a controlled, triggerable manner are useful in a variety of applications, such as maintaining security and supply chain integrity.

BRIEF SUMMARY

Some embodiments are directed to a system that includes a stress-engineered substrate. The stress-engineered substrate comprises at least one tensile stress layer having a residual tensile stress and at least one compressive stress layer having a residual compressive stress. The at least one tensile layer and the at least one compressive layer are coupled such that the at least one tensile stress layer and the at least one compressive stress layer are self-equilibrating. At least one functional device is disposed on the stress-engineered substrate. The stress-engineered substrate is configured to fracture in response to energy applied to the stress-engineered substrate. Fracturing the stress-engineered substrate also fractures the functional device. The system includes at least one decoy device. Fragments of the decoy device are configured to obscure one or more physical characteristics of the functional device and/or one or more functional characteristics of the functional device after the functional device is fractured.

Some embodiments involve a method of maintaining the security of a functional device. Energy is applied to a stress-engineered substrate having at least one functional device disposed thereon. The stress-engineered substrate comprises at least one tensile stress layer having a residual tensile stress and at least one compressive stress layer having a residual compressive stress. The at least one tensile layer and the at least one compressive layer are coupled such that the at least one tensile stress layer and the at least one compressive stress layer are self-equilibrating. The applied energy creates an initial fracture in the stress-engineered substrate. The initial fracture generates propagating fractures in the stress-engineered substrate. The propagating fractures fragment the substrate and the functional device. One or more functional characteristics and/or one or more physical characteristics of the functional device are obscured by fragments of a decoy device.

The above summary is not intended to describe each embodiment or every implementation. A more complete understanding will become apparent and appreciated by referring to the following detailed description and claims in conjunction with the accompanying drawings.

BRIEF DESCRIPTION OF DRAWINGS

The figures are not necessarily to scale. Like numbers used in the figures refer to like components. However, it will be understood that the use of a number to refer to a component in a given figure is not intended to limit the component in another figure labeled with the same number.

DETAILED DESCRIPTION OF ILLUSTRATIVE EMBODIMENTS

Stress-engineered substrate technology can be used to fragment devices such as integrated circuits into smaller pieces to prevent a hostile party from obtaining information about the devices. Depending on the size of the fragmentation, the ability to reconstruct the devices and/or retrieve data stored in the devices will vary. Embodiments disclosed herein relate to additional measures beyond fragmentation that can be used to create confusion for the hostile party. These additional measures make it more difficult for the hostile party to extract information such as circuit design and/or stored data from fragmented chips.

Figure 1:
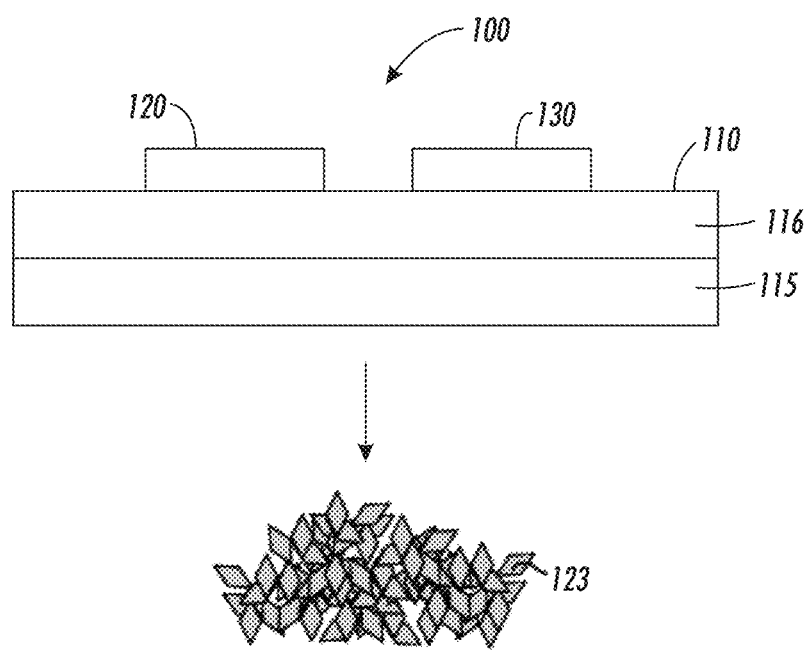
FIGS. 1 to 4 illustrate systems that include one or more decoy devices in accordance with various embodiments.

FIG. 1 is a diagram of a system 100 comprising at least one functional device 120 and at least one decoy device 130. In many systems multiple functional device and/or multiple decoy devices may be present. FIG. 1 illustrates both the functional device 120 and the decoy device 130 disposed on a frangible, stress-engineered substrate 110. As discussed further herein, in other implementations the functional 120 and decoy 130 devices may not be disposed on the same substrate.

The functional 120 and the decoy 130 devices may be any type of devices. The functional device 120 may comprise one or more integrated circuits and the decoy device 130 may comprise one or more integrated circuits. In some embodiments, the functional 120 and decoy 130 devices are integrated circuits fabricated using well-known low-cost fabrication techniques (e.g., CMOS or SOI), for example.

The substrate 110 is stressed such that when a small initial fracture is created in the substrate 110, the initial fracture causes propagating fractures that transmit through the substrate 110. When the functional 120 and decoy 130 devices are co-located on the same substrate 110 as in FIG. 1, the propagating fractures cause the substrate 110, the functional device 120 and the decoy device 130 to break into pieces 123.

The decoy device 130 may be positioned relative to the functional device 120 so that when fragmentation occurs, the fragments of the decoy device 130 mix with the fragments of the functional device 120. For example, the decoy device 130 may be placed near the functional device 120 so that when fragmentation of the functional 120 and decoy 130 devices occurs, the fragments of the decoy device 130 mix with the fragments of the functional device 120 making reconstitution of the functional device difficult to accomplish.

The system may be configured such that fragmentation occurs of functional device 120 and the decoy device 130 occurs substantially simultaneously or close in time. In some embodiments, the decoy device 130 may fragment before and/or or after fragmentation of the functional device 120. In some embodiments, the system 100 may include multiple decoy devices 130, at least one of the multiple decoy devices 130 arranged to fragment before fragmentation of the functional device 120 and at least another of the multiple decoy devices 130 arranged to fragment after fragmentation of the functional device 120.

The decoy device 130 is designed to create confusion if an attempt is made to reassemble the pieces 123 to reconstitute and/or reanimate the functional device 120 after the functional device 120 is fragmented. The decoy device 130 may be designed to obscure physical and/or functional characteristics of the functional device after the decoy device 130 and the functional device 120 are fragmented. For example, the decoy device 130 may obscure one or more physical characteristics of the functional device such as mass, size, shape, material, and/or coatings of the functional device 120.

The functional and decoy device may be fragmented in a way that makes it difficult to distinguish which fragments belong to the functional device and which fragments belong to the decoy device. Such fragmentation makes it difficult to discern the mass, size or shape of the functional device from the fragments 123 of the decoy device 130 and the functional device 120.

In some embodiments, the decoy device 130 is composed entirely of the same materials as the functional device 120. Alternatively, the decoy device 130 may include one or more materials some or all of which are different from the materials of the functional device 120. For example, the decoy device 130 may include one or more decoy materials wherein the decoy materials are not needed to support or enhance the functionality of the functional device. In some embodiments, both the functional 120 and the decoy 130 devices may include the decoy materials.

According to some implementations, the functional device 120 comprises one or more first coatings and the decoy device comprises one or more second coatings. Some or none of the second coatings may be the same as the first coatings of the functional device. For example, the decoy device and/or the functional device may comprise decoy coatings.

In some embodiments, when the functional device 120 is fragmented, the fragments of the functional device 120 have a first thickness or a plurality of first thicknesses. When the decoy device is fragmented, the fragments of the decoy device 130 may comprise fragments have a second thickness or a plurality of second thicknesses different from the first thicknesses. In some implementations, fragments of the functional device may include some of the second thicknesses and/or fragments of the decoy device may include some of the first thicknesses.

The decoy device 130 may obscure one or more functional characteristics of the functional device 120 such as circuit design, circuit operation and/or data stored in the functional device 120. In some embodiments, the decoy device 130 may include decoy circuits that are different from the circuits of the functional device 120. The decoy circuits may be arranged such that the circuit design and/or circuit operation of the functional device 120 is obscured by the decoy circuits when both the decoy device 130 and functional device 120 are fragmented.

In some embodiments, the decoy device 130 includes one or more integrated circuits that are identical to or similar to the integrated circuits of the functional device 120. The decoy device circuits store data that is different from the data stored in the integrated circuits of the functional device 120. The data stored in the decoy device 130 may corrupt the data stored in the functional device 120 when both devices 120, 130 when a hostile party tries to reconstitute the data stored in the functional device 120 from the fragments 123. For example, in some embodiments the data stored in the decoy device 130 may be null data.

Figure 2A:
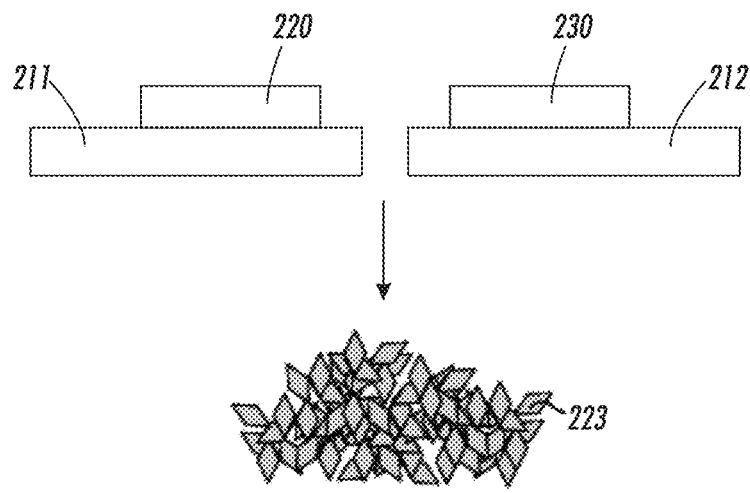

The decoy device need not be on the same substrate as the functional device. FIG. 2A illustrates the functional device 220 disposed on a first substrate 211 and the decoy device 230 disposed on a separate second substrate 212. The substrate 211 is stressed such that when a small initial fracture is created in the substrate 211, the initial fracture causes propagating fractures that transmit through the substrate 211 and into the functional device 220, breaking the functional device 220 into pieces. Similarly, the substrate 212 is stressed such that when a small initial fracture is created in the substrate 212, the initial fracture causes propagating fractures that transmit through the substrate 212 and into the decoy device 230, breaking the decoy device 230 into pieces. The fracture of the first substrate 211 and the functional device 220 may occur concurrently or close in time with the fracture of the second substrate 212 and the decoy device 230. The first substrate 211 and the functional device 220 may be physically located close to second substrate 212 and the decoy device 230. The fracture of the first and second substrates 211, 212 and the functional and decoy devices 220, 230 produces fragments 223 that obscure the mechanical and/or functional characteristics of the functional device 220.

Figure 2B:
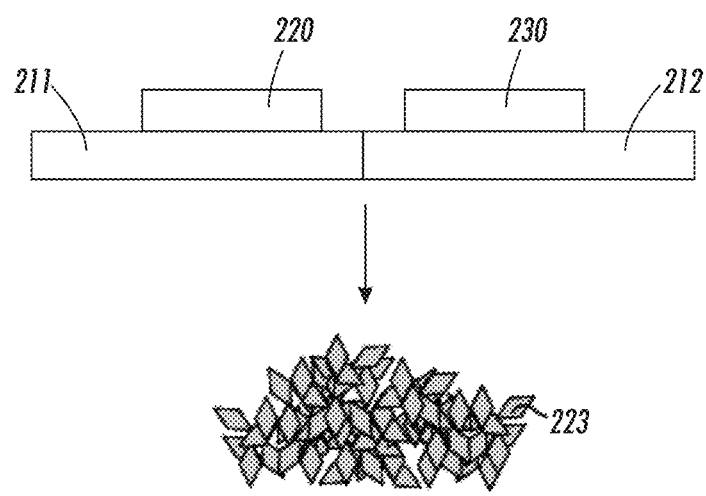

As depicted in FIG. 2B, in some implementations the first and second substrates 211, 212 may be mechanically coupled such that the propagating fractures propagate from one substrate 211, 212 to the other 212, 211, fragmenting both substrates 211, 212, the functional device 220 and the decoy device 230.

Figure 3:
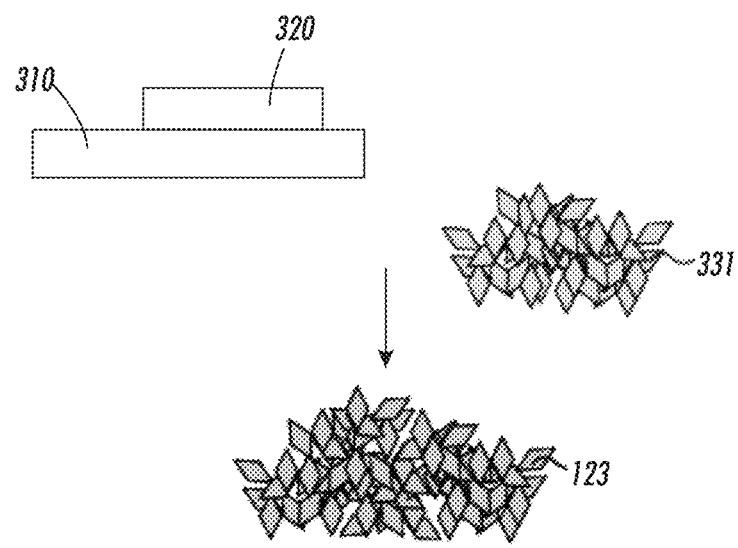

FIG. 3 illustrates an embodiment in which the decoy device is pre-fragmented, such that the decoy device is a plurality fragments 331. The functional device 320 is disposed on a substrate 310. An initial fracture in the substrate causes propagating fractures through the substrate 310 and the functional device 320. The fragments of the substrate 310 and the functional device 320 combine with the fragments of the decoy device 331, obscuring mechanical and/or functional characteristics of the functional device 320. FIG. 3 shows the combined fragments 123.

Figure 4:
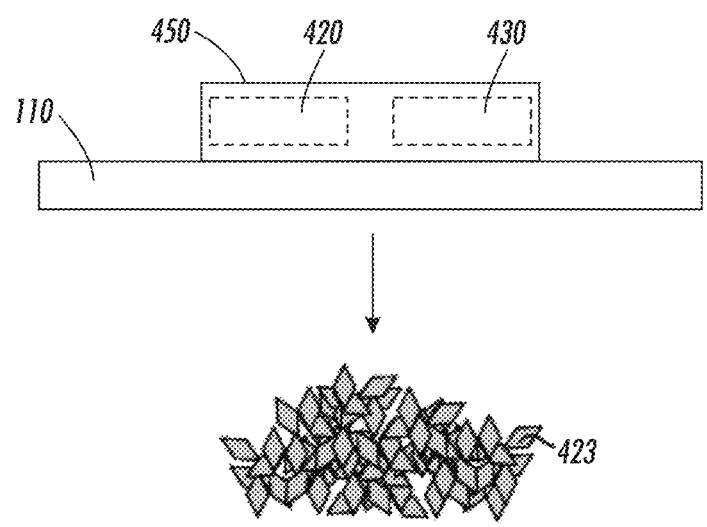

According to some embodiments, as shown in FIG. 4, an integrated circuit 450 disposed on a stress-engineered substrate 410 includes both the functional device 420 and the decoy device 430. An initial fracture in the stress-engineered substrate 410 causes propagating fractures that fragment 423 the integrated circuit 450 including the functional device 420 and the decoy device 430.

The process used in preparing the stress-engineered substrate, e.g., chemical tempering, imparts a large stress gradient within the thickness of the support substrate. This stored mechanical energy is abruptly released when an initial fracture is formed. In some embodiments discussed below, the initial fracture is caused when a localized area is heated. For example, rapid heating and subsequent cooling damage the substrate leading to the initial fracture and propagating fractures.

As shown in the cross sectional view of FIG. 1 the stress-engineered substrate 110 may be a wafer-like structure including at least one tensile stress layer 115 having a residual tensile stress and at least one compressive stress layer 116 having a residual compressive stress. Tensile stress layer 115 and compressive stress layer 116 (collectively referred to herein as "stress-engineered layers") can be operably integrally connected together such that residual tensile and compressive stresses are self-equilibrating and produce a stress gradient. As set forth in additional detail below, the stress-engineered layers 116 and 115 may be fabricated either by post-treating a substrate material using strategies similar to glass tempering (e.g., by way of heat or chemical treatment), or by depositing the substrate layers using, for example chemical, vapor deposition techniques in which the deposition parameters (i.e., temperature, pressure, chemistry) are varied such that the layers collectively contain a significant inbuilt stress gradient. Note that the arrangement of stress-engineered layers 116 and 115 indicated in FIG. 1 is not intended to be limiting in that one or more stress-engineered and/or non-stressed substrate layers may be disposed on and/or between the two stress-engineered layers.

Various methods may be used to fabricate the stress-engineered substrate. One example approach involves thin film sputter deposition. In thin film sputter deposition, generally two distinct regimes can be identified leading to very different film morphology and characteristics, and result in either compressive or tensile stress. Metals are often used because of functionality (e.g., electrical properties), their structural qualities (e.g., ductility), and the fact that a conductive sputter target allows for a simple, high yield, glow discharge DC magnetron sputtering process. However, stress-engineered metal oxides and glasses (silicon oxides) can be sputtered as well; these insulating or semiconducting films can be sputter deposited by either radiofrequency (RF) sputtering or by reactive sputtering in a mixed inert/reactive gas plasma (e.g. argon/oxygen).

To achieve reliable fragmentation of the stress-engineered substrate, a method for generating stressed support substrates involves adapting stress-engineered thin film fabrication techniques with ion-exchange tempering to create stress profiles in glass (SiO2) substrates, e.g., glass (SiO2) substrates.

Figure 5A:
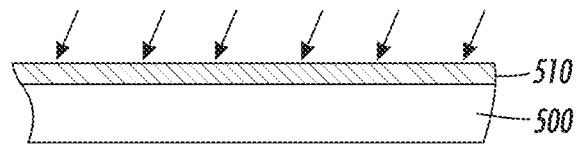
FIGS. 5A to 5E illustrate a first methodology in which a stress-engineered substrate is fabricated in accordance with some embodiments.
Figure 5B:
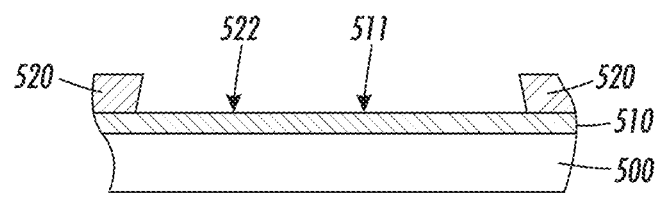
Figure 5C:
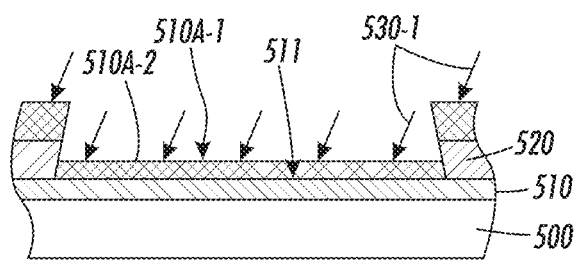
Figure 5D:
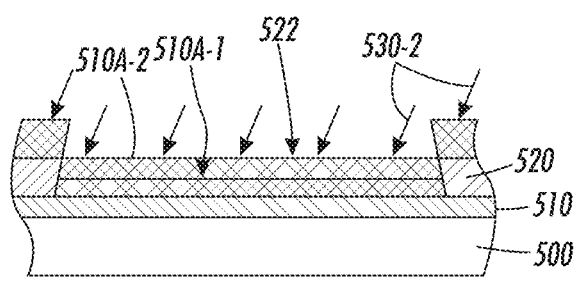
Figure 5E:

FIGS. 5A to 5E illustrate a first methodology in which a stress-engineered support substrate 510A is built up by patterned $SiO_2$ stress-engineered support substrates generated entirely using plasma vapor deposition (PVD) techniques. This method provides a high degree of control over the specific stress profile generated in the stress-engineered support substrate and provides for continuous control over glass formulation and morphology through the thickness dimension of the stress-engineered support substrate. A wafer 500 (e.g., silicon or other material) is coated with a release layer 510, most likely a metal. In FIG. 5B, a thick liftoff mask 520 is then patterned on release layer 510 such that mask 520 defines an opening 522. Note that wafer 500, release layer 510, and mask 520 form a sacrificial structure. Referring to FIGS. 5C and 5D, PVD processing is then used to create the stress engineered layers 510A-1 and 510A-2 in opening 522, placing stresses in the deposited substrate material 530-1 and 530-2, for example, by altering the process parameters (e.g., using different temperatures T1 and T2 and/or pressures P1 and P2). Finally, as indicated in FIG. 5E, the mask is then lifted off, and stress-engineered substrate 510A is singulated (removed) from the remaining sacrificial structure by under-etching the release layer.

Figure 6A:
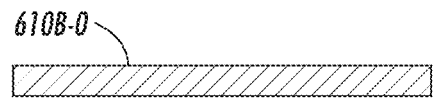
FIGS. 6A to 6E illustrate a second methodology in which a stress-engineered substrate is fabricated in accordance with some embodiments.
Figure 6B:
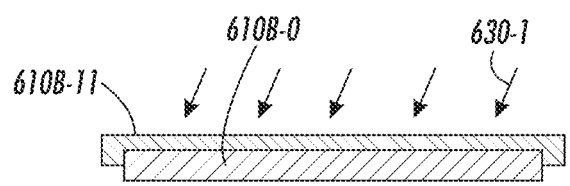
Figure 6C:
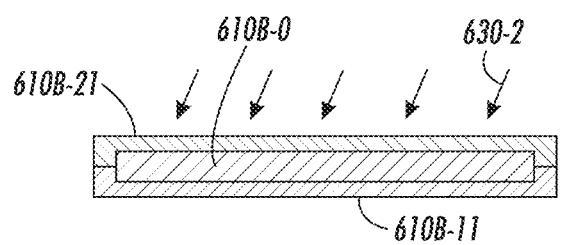
Figure 6D:
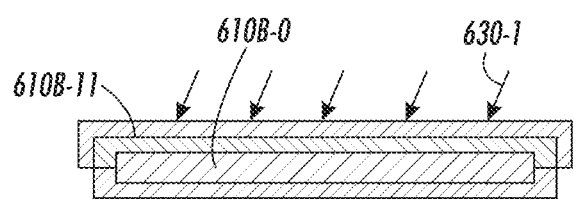
Figure 6E:
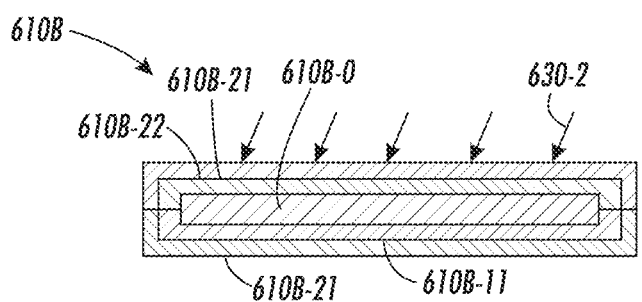

FIGS. 6A to 6E illustrate a second methodology in which a stress-engineered support substrate 610B is built up by patterned $SiO_2$ on a thin glass core using PVD techniques. This methodology provides a high degree of control over the specific stress profile generated in the stress-engineered support substrate. Referring to FIG. 6A, the process begins using a substantially unstressed glass core substrate 610B-0 having a thickness T0 in the range of 25 µm and 100 µm. Suitable glass core substrates are currently produced by Schott North America, Inc. of Elmsford, N.Y., USA). Referring to FIGS. 6B to 6E, $SiO_2$ is then deposited on alternating sides of core substrate 410B-0 via PVD using methods similar to those described above. Specifically, FIG. 6B shows the deposition of material 630-1 in a manner that forms stress-engineered layer 610B-11 on core substrate 610B-0. FIG. 6C shows the deposition of material 630-2 in a manner that forms stress-engineered layer 610B-21 on an opposite side of core substrate 610B-0. FIG. 6C shows the subsequent deposition of material 630-1 in a manner that forms stress-engineered layer 610B-12 on core layer 610B-11, and FIG. 6E shows the deposition of material 630-2 in a manner that forms stress-engineered layer 610B-22 layer 610B-21. FIG. 6E shows completed stress-engineered support substrate 610B including core substrate (central, substantially unstressed layer) 610B-0 with stress-engineered layers 610B-11, 610B-12, 610B-21 and 610B-22 formed thereon.

Figure 7A:
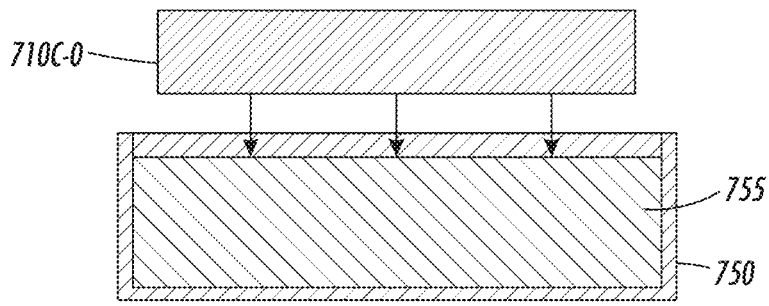
FIGS. 7A to 7E illustrate a third methodology in which a stress-engineered substrate is fabricated in accordance with some embodiments.
Figure 7B:
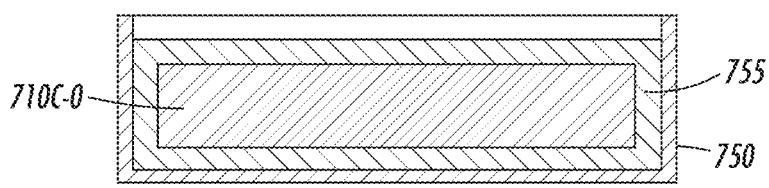
Figure 7C:
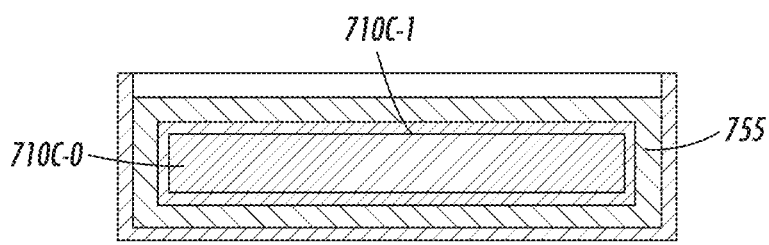
Figure 7D:
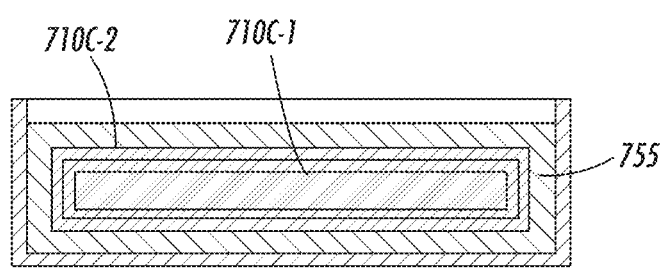
Figure 7E:
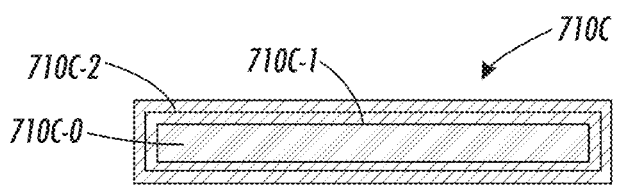

FIGS. 7A to 7E illustrate a third methodology in which a stress-engineered substrate 710C is produced by subjecting a core substrate to one of an ion-exchange tempering treatment, a chemical treatment and a thermal treatment. Specifically, FIGS. 7A to 7E illustrate an exemplary ion-exchange tempering treatment during which various stress profiles are introduced in a core substrate via molten-salt ion exchange. FIG. 7A shows a core substrate 710C-0 over a vat 750 containing a molten-salt solution 755. FIG. 7B shows core substrate 710C-0 immediately after submersion in molten-salt solution 755, FIG. 7C shows core substrate 710C-0 after a first time period of submersion in molten-salt solution 555 in which a first stress-engineered layer 710C-1 is formed, and FIG. 7D shows the structure after a second time period of submersion in molten-salt solution 755 in which a second stress-engineered layer 710C-2 is formed on first stress-engineered layer 710C-1. FIG. 7E shows completed stress-engineered support substrate 700C including central core substrate 710C-0 and stress-engineered layers 710C-1 and 710C-2.

According to a fourth methodology, a hybrid of the above second and third methods is employed in which diced, thin glass core substrates are ion-exchange tempered, and then multiple layers of SiO2 are deposited on the tempered substrates to further increase the induced stresses.

According to some embodiments, the system may also include a triggering mechanism that supplies the energy that create the initial fracture. For example, the trigger mechanism may supply mechanical energy, thermal energy, electrical energy, chemical energy, magnetic energy, and/or optical energy to create the initial fracture. The trigger mechanism may operate in response to a trigger signal that can be generated manually or by a sensor configured to sense a trigger stimuli. The trigger stimuli may comprise one or more of electromagnetic radiation (e.g., radio frequency (RF) radiation, infrared (IR radiation), visible light, ultraviolet (UV) radiation, x-ray radiation, etc.), vibration, a chemical, vapor, gas, sound, temperature, passage of time, moisture, an environmental condition, etc. For embodiments in which the trigger stimulus is visible light, the sensor may be configured to generate the trigger signal in response to exposure to broadband light, such as sunlight or room light, or narrow band light, such as green, red, or blue visible light. For example, the green, red or blue light may be produced by a laser.

In some embodiments, the sensor is configured to detect a tampering event. For example, the tampering event can be detected when the device is exposed to a chemical used for removal of a package cover, the device is vibrated above a threshold vibration, and/or if snooping with x-rays occurs.

In some embodiments, the sensor is a clock that detects the passage of time. After a predetermined amount of time has passed, a trigger signal is generated to activate the trigger mechanism.

In some embodiments, the trigger mechanism may supply mechanical energy to the substrate to form the initial fracture. The initial fracture can be formed by a mechanical impact, e.g. supplied by an electromagnet or other actuator. In some embodiments, the initial fracture can be formed by concurrently creating a weakened region and applying mechanical stress to the substrate sufficient to cause the initial fracture as discussed in commonly owned U.S. patent application Ser. No. 15/981,328 filed May 16, 2018 which is incorporated herein by reference.

The trigger mechanism may supply thermal energy in the form of sudden heating and/or cooling to create the initial fracture as discussed in commonly owned U.S. patent application Ser. Nos. 15/220,164 and 15/220,221 filed Jul. 26, 2016 which are incorporated herein by reference. Electrical energy in the form of current may flow through a resistive heater disposed on the substrate to provide the fracture initiating thermal energy. Alternatively, optical energy in the form of intense laser radiation may be directed to an optical absorber pad on the substrate The intense radiation heats the absorber pad operates as a trigger mechanism that generates heat which provides the fracture initiating thermal energy. In some embodiments, the trigger mechanism may release a chemical which causes a chemical reaction which generates the initial fracture that creates propagating cracks that destroy the substrate and devices disposed thereon.

Figure 8A:
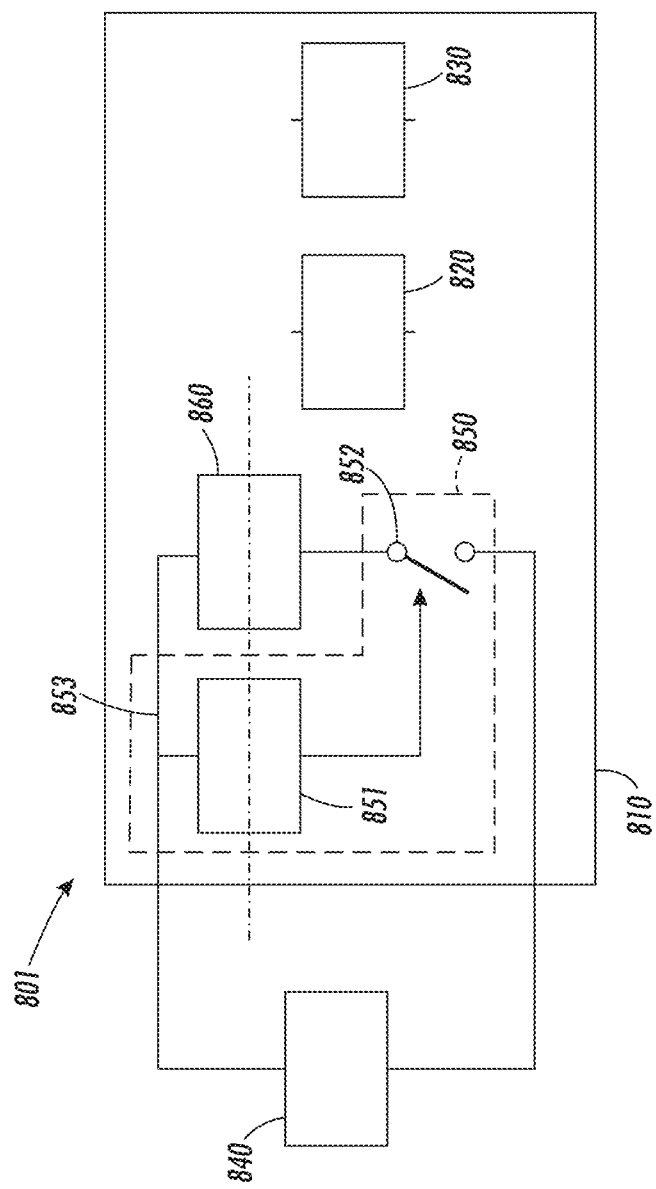
FIGS. 8A, 8B, and 8C show three versions of a system comprising a stress-engineered substrate and triggering mechanism for fracturing the stress-engineered substrate in accordance with some embodiments.
Figure 8B:
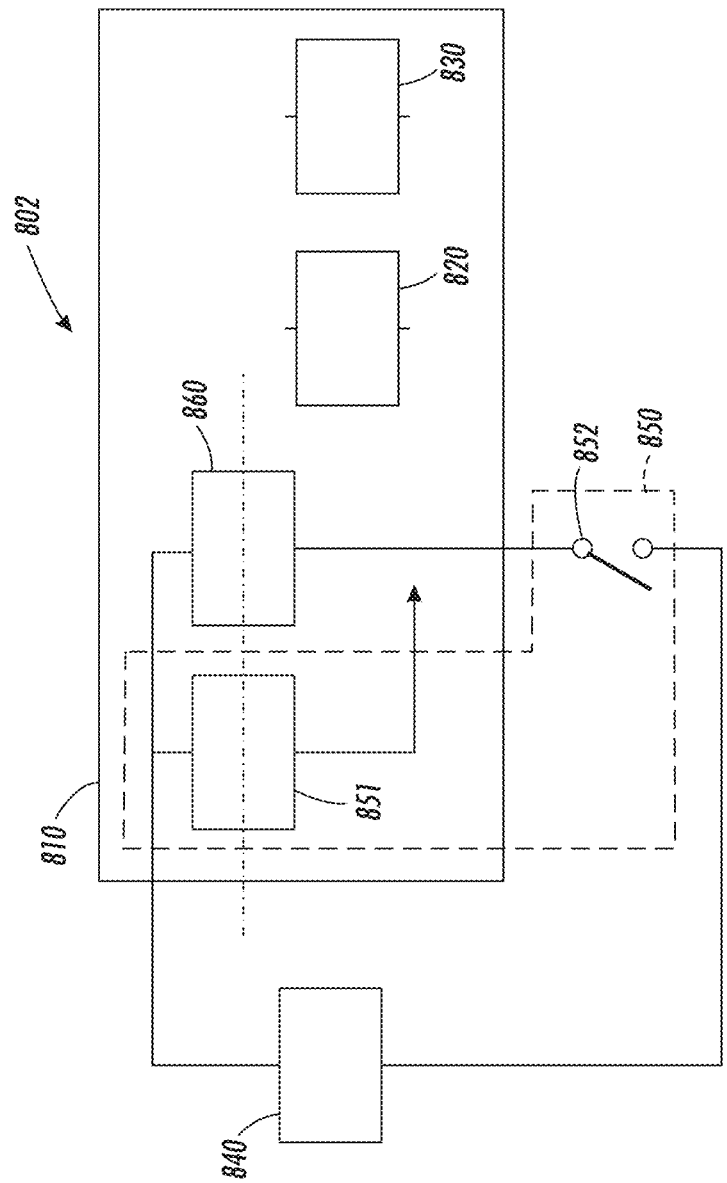
Figure 8C:
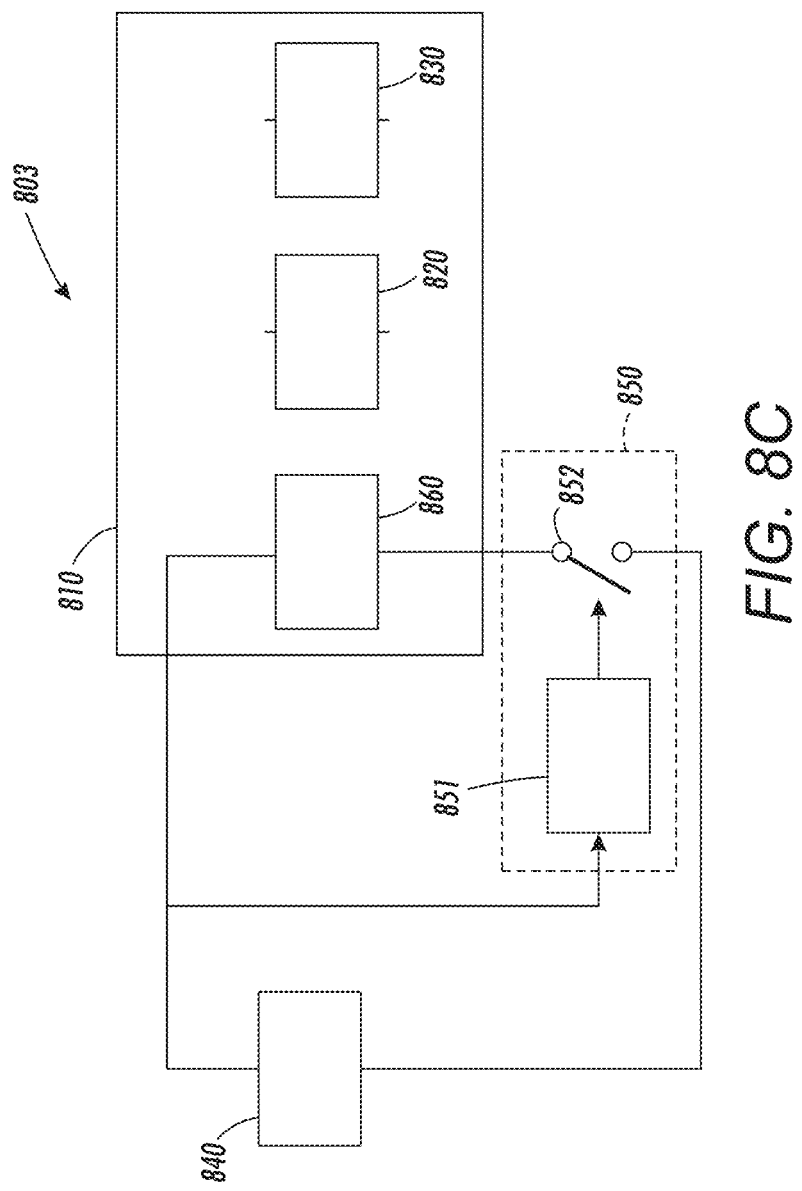

FIGS. 8A, 8B, and 8C show three versions of a system 801, 802, 803 comprising a at least one functional device 820 and at least one decoy device 830 disposed on a stress-engineered substrate configured to fracture in response to a trigger signal. For convenience, the triggering mechanism is described as a heater, however, the concepts described with reference to FIGS. 8A, 8B, and 8C are also applicable to any type of trigger mechanism, including those discussed above. For example, in some implementations, the trigger mechanism need not be electrically coupled to the trigger circuitry.

System 801, 802, 803 includes a stress-engineered substrate 810, a functional device 820, a decoy device, 830, and a trigger mechanism 860. The trigger mechanism 860 is configured to apply energy to the substrate 810 that causes the initial fracture which in turn leads to propagating fractures that fragment the substrate 810, functional device 820, and decoy device 830. For convenience, the trigger mechanism is described as a heater, however, the concepts described with reference to FIGS. 8A, 8B, and 8C are also applicable to any type of trigger mechanism, including those discussed above.

The heater 860 is thermally coupled to the substrate 810. In some embodiments, the heater 860 is a resistive conductive film that is energized by flowing electrical current. In other embodiments, the heater is energized by radio-frequency-coupled microwave. In yet another embodiment, the heater is an optical absorber energized by an intense laser beam. In the resistive conductive film embodiment, the heater can be a thin film fuse that breaks when the temperature reaches a sufficiently high value.

Trigger circuitry 850 is configured to cause the heater 860 to be coupled to a power source 840 in response to exposure to a trigger stimulus. The trigger circuitry 850 may include a sensor 851 and a switch 852. The sensor 851 generates a trigger signal when exposed to the trigger stimulus. After activation by the trigger signal, the switch 852 electrically couples the power source 840 to the heater 860. When energized by the power source 840, the heater 860 generates heat such that the heating and subsequent cooling of the substrate form an initial fracture of the substrate 810. The initial fracture generates propagating fractures through the substrate 810, functional device 820, and decoy device 830. The substrate 810 is engineered to fracture and break into pieces. In some embodiments, the fracture dynamics are designed so that the substrate 810 fractures into small particles that have length, width, and height dimensions of less than about 900 µm, less than about 500 µm, or even less than about 100 µm.

In one version of the system 801 shown in FIG. 8A, the sensor 851 and switch 852 are located on the substrate 810. In another version of the device 802, shown in FIG. 8B, the switch 852 is not located on the stress-engineered substrate 810. In yet another version of the device 803 shown in FIG. 8C, neither the sensor 851 nor switch 852 is located on the substrate 810.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein. The use of numerical ranges by endpoints includes all numbers within that range (e.g. 1 to 5 includes 1, 1.5, 2, 2.75, 3, 3.80, 4, and 5) and any range within that range.

Various modifications and alterations of the embodiments discussed above will be apparent to those skilled in the art, and it should be understood that this disclosure is not limited to the illustrative embodiments set forth herein. The reader should assume that features of one disclosed embodiment can also be applied to all other disclosed embodiments unless otherwise indicated. It should also be understood that all U.S. patents, patent applications, patent application publications, and other patent and non-patent documents referred to herein are incorporated by reference, to the extent they do not contradict the foregoing disclosure.

The invention claimed is:

1. A system, comprising:
   a stress-engineered substrate comprising at least one tensile stress layer having a residual tensile stress and at least one compressive stress layer having a residual compressive stress and being mechanically coupled to the at least one tensile stress layer such that the at least one tensile stress layer and the at least one compressive stress layer are self-equilibrating;

an energy source coupled to the stress-engineered substrate;

at least one functional device disposed on the stress-engineered substrate, the stress-engineered substrate configured to fracture in response to energy generated by the energy source and applied to the stress-engineered substrate wherein fracturing the stress-engineered substrate also fractures the functional device; and at least one decoy device configured to obscure at least one of one or more physical characteristics of the functional device and one or more functional characteristics of the functional device after the fracturing of the functional device, wherein:

the functional device comprises one or more integrated circuits that store data; and the decoy device includes one or more integrated circuits that are identical or similar to the integrated circuits of the functional device and store different data from the data stored in the integrated circuits of the functional device.

2. The system of claim 1, wherein the decoy device is disposed on the stress-engineered substrate and the fracturing of the stress-engineered substrate also fractures the decoy device.

3. The system of claim 1, wherein the decoy device is not disposed on the stress-engineered substrate and is pre-fragmented.

4. The system of claim 1, further comprising a second stress-engineered substrate, wherein the decoy device is disposed on the second stress-engineered substrate and the second stress-engineered substrate is configured to fracture in response to energy applied to the second stress-engineered substrate, wherein fracturing the second stress-engineered substrate also fractures the decoy device.

5. The system of claim 4, wherein the first stress-engineered substrate and the second stress-engineered substrate are mechanically coupled such that fractures propagating in one of the stress-engineered substrates are transmitted to the other stress-engineered substrate, the propagating fractures fragmenting the functional device and the decoy device.

6. The system of claim 1, wherein the one or more physical characteristics of the functional device obscured by the decoy device comprise one or more of mass, size, shape, material or coatings of the functional device.

7. The system of claim 1, wherein after fracturing:
the functional device comprises fragments having a first thickness; and
the decoy device comprises fragments having a plurality of different thicknesses.

8. The system of claim 1, wherein:
the functional device comprises one or more first coatings; and
the decoy device comprises a plurality of second coatings.

9. The system of claim 1, wherein:
the functional device comprises a one or more first materials; and
the decoy device comprises a plurality of second materials.

10. The system of claim 1, wherein the one or more functional characteristics of the functional device obscured by the decoy device comprises one or more of circuit operation and stored data.

11. The system of claim 1, wherein the functional device comprises one or more integrated circuits and the decoy device includes one or more integrated circuits that are different from the integrated circuits of the functional device.

12. The system of claim 11, wherein data stored in the integrated circuits of the functional device are different from data stored in the integrated circuits of the decoy device.

13. The system of claim 12, wherein data stored in the decoy device are null data.

14. The system of claim 12, wherein the data stored in the decoy device are configured to corrupt the data stored in the functional device.

15. The system of claim 1, wherein:
the decoy device includes one or more integrated circuits that are identical to the integrated circuits of the functional device and store different data from the data stored in the integrated circuits of the functional device.

16. The system of claim 1, wherein the applied energy comprises one or more of mechanical energy, thermal energy, electrical energy, chemical energy, magnetic energy, and optical energy.

17. The system of claim 1, further comprising
trigger circuitry configured to cause the energy to be applied to the stress-engineered substrate.

18. The system of claim 17, wherein:
the energy source comprises a heater thermally coupled to the stress-engineered substrate; and
the trigger circuitry comprises a switch configured to activate the heater.

19. A method, comprising:
applying energy to a stress-engineered substrate having at least one functional device disposed thereon, the functional device comprising one or more integrated circuits that store data;
the applied energy creating an initial fracture in the stress-engineered substrate;
the initial fracture generating propagating fractures in the stress-engineered substrate;
the propagating fractures fragmenting the substrate and the functional device; and
obscuring at least one of a functional characteristic and a physical characteristic of the functional device after the functional device fragments using fragments of a decoy device, wherein:
the decoy device includes one or more integrated circuits that are identical or similar to the integrated circuits of the functional device and store different data from the data stored in the integrated circuits of the functional device.

20. The method of claim 19, wherein the decoy device is disposed on the stress-engineered substrate and fracturing of the stress-engineered substrate also fractures the decoy device.

21. A system, comprising:
a stress-engineered substrate comprising at least one tensile stress layer having a residual tensile stress and at least one compressive stress layer having a residual compressive stress and being mechanically coupled to the at least one tensile stress layer such that the at least one tensile stress layer and the at least one compressive stress layer are self-equilibrating;
an energy source coupled to the stress-engineered substrate;
at least one functional device disposed on the stress-engineered substrate, the stress-engineered substrate configured to fracture in response to energy generated by the energy source and applied to the stress-engineered substrate wherein fracturing the stress-engineered substrate also fractures the functional device;

at least one decoy device configured to obscure at least one of one or more physical characteristics of the functional device and one or more functional characteristics of the functional device after the fracturing of the functional device; and a second stress-engineered substrate, wherein the decoy device is disposed on the second stress-engineered substrate and the second stress-engineered substrate is configured to fracture in response to energy applied to the second stress-engineered substrate, wherein fracturing the second stress-engineered substrate also fractures the decoy device.

22. The system of claim 21, wherein the first stress-engineered substrate and the second stress-engineered substrate are mechanically coupled such that fractures propagating in one of the stress-engineered substrates are transmitted to the other stress-engineered substrate, the propagating fractures fragmenting the functional device and the decoy device.

23. A system, comprising:

a stress-engineered substrate comprising at least one tensile stress layer having a residual tensile stress and at least one compressive stress layer having a residual compressive stress and being mechanically coupled to the at least one tensile stress layer such that the at least one tensile stress layer and the at least one compressive stress layer are self-equilibrating;

an energy source coupled to the stress-engineered substrate;

at least one functional device disposed on the stress-engineered substrate, the stress-engineered substrate configured to fracture in response to energy generated by the energy source and applied to the stress-engineered substrate wherein fracturing the stress-engineered substrate also fractures the functional device; and at least one decoy device configured to obscure at least one of one or more physical characteristics of the functional device and one or more functional characteristics of the functional device after the fracturing of the functional device, wherein the decoy device is not disposed on the stress-engineered substrate and is pre-fragmented.

* * * * *